United States Patent
Ciarlini et al.

(10) Patent No.: US 9,660,666 B1
(45) Date of Patent: May 23, 2017

(54) CONTENT-AWARE LOSSLESS COMPRESSION AND DECOMPRESSION OF FLOATING POINT DATA

(71) Applicant: EMC IP Holding Company LLC, Hopkinton, MA (US)

(72) Inventors: Angelo E. M. Ciarlini, Rio de Janeiro (BR); Alex L. Bordignon, Rio de Janeiro (BR); Rômulo Teixeira de Abreu Pinho, Niteroi (BR); Edward José Pacheco Condori, Rio de Janeiro (BR)

(73) Assignee: EMC IP Holding Company LLC, Hopkinton, MA (US)

( * ) Notice: Subject to any disclaimer, the term of this patent is extended or adjusted under 35 U.S.C. 154(b) by 180 days.

(21) Appl. No.: 14/579,130

(22) Filed: Dec. 22, 2014

(51) Int. Cl.
  *G06F 7/483* (2006.01)
  *H03M 7/30* (2006.01)
(52) U.S. Cl.
  CPC ............. *H03M 7/30* (2013.01); *G06F 7/483* (2013.01)
(58) Field of Classification Search
  None
  See application file for complete search history.

(56) References Cited

U.S. PATENT DOCUMENTS

| 8,959,130 | B2 * | 2/2015 | Wegener | G06F 7/483 708/203 |
| 9,337,863 | B1 * | 5/2016 | Maximo | H03M 7/40 |
| 2007/0240129 | A1 * | 10/2007 | Kretzschmar | G06F 7/38 717/136 |
| 2009/0030960 | A1 * | 1/2009 | Geraghty | H03M 7/30 708/203 |
| 2010/0299378 | A1 * | 11/2010 | Kretzschmar | G06F 7/38 708/203 |

OTHER PUBLICATIONS

Elias, P., "Universal codeword sets and representations of the integers," Information Theory, IEEE Transactions on, vol. 21, No. 2, pp. 194-203, Mar. 1975.

(Continued)

*Primary Examiner* — David H Malzahn
(74) *Attorney, Agent, or Firm* — Ryan, Mason & Lewis, LLP (57) ABSTRACT

Lossless content-aware compression and decompression techniques are provided for floating point data, such as seismic data. A minimum-length compression technique exploits an association between an exponent and a length of the significand, which corresponds to the position of the least significant bit of the significand. A reduced number of bits from the significand can then be stored. A prediction method is also optionally previously applied, so that residual values with shorter lengths are compressed instead of the original values. An alignment compression technique exploits repetition patterns in the floating point numbers when they are aligned to the same exponent. Floating point numbers are then split into integral and fractional parts. The fractional part is separately encoded using a dictionary-based compression method, while the integral part is compressed using a delta-encoding method. A prediction method is also optionally previously applied to the integral part, thereby increasing the compression ratio.

23 Claims, 5 Drawing Sheets

(56) References Cited

OTHER PUBLICATIONS

Mandyam, G. et. al., "Lossless seismic data compression using adaptive linear prediction," Geoscience and Remote Sensing Symposium, 1996. IGARSS '96. 'Remote Sensing for a Sustainable Future', International, vol. 2, No., pp. 1029, 1031 vol. 2, May 27-31, 1996.

Ciarlini et al., U.S. Appl. No. 14/230,510, "Heteroscedastic Data Compression Using Arima-Garch Model Estimation", filed Mar. 31, 2014.

* cited by examiner

CONTENT-AWARE LOSSLESS COMPRESSION AND DECOMPRESSION OF FLOATING POINT DATA

FIELD

The field relates generally to data compression of signal data, such as seismic data.

BACKGROUND

Data compression techniques are commonly used to achieve a low bit rate in the digital representation of signals for efficient processing, transmission, and storage. The size of seismic datasets, for example, continues to increase due to the need of extracting oil from more complex geologies. This drives demand for better sensor acquisition technologies, higher resolution hydrocarbon models, more iterations of analysis cycles, and increased integration of a broader variety of data types. In addition, four-dimensional (4D) modeling techniques have been developed to monitor and simulate reservoirs over time, based on the acquisition of seismic data from the same area at different points in time. Thus, seismic data compression has become important in geophysical applications, for efficient processing, storage and transmission of seismic data. A need therefore exists for improved techniques for compressing both raw and processed seismic data.

SUMMARY

Illustrative embodiments of the present invention provide methods and apparatus for content-aware lossless compression and decompression of floating point data, such as seismic data. In one exemplary embodiment, at least one floating point number is compressed by obtaining the at least one floating point number represented using one or more bits to indicate a sign of the at least one floating point number and one or more additional bits to indicate an exponent at a given base and a significand of the at least one floating point number, wherein the significand has a length equal to a number of bits between a most significant bit of the significand and a least significant bit of the significand having a predefined binary value; and encoding the at least one floating point number by encoding the exponent and the length as a single code.

In another exemplary embodiment, at least one floating point number is compressed by obtaining the at least one floating point number represented using one or more bits to indicate a sign of the at least one floating point number and one or more additional bits to indicate an exponent at a given base and a significand of the at least one floating point number; aligning the at least one floating point number to an exponent that corresponds to one bit of the significand; separating each of the at least one floating point number into an integral portion and the fractional portion; and encoding the fractional portion of the at least one floating point number using a dictionary-based compression method.

In one or more embodiments, the compression ratio is optionally increased by applying a linear prediction algorithm to at least a portion of the at least one floating point number to generate a prediction, and the compression comprises aligning the prediction to the at least a portion of the at least one floating point number, truncating the prediction to end at a bit immediately before a least significant bit having the predefined binary value of the at least a portion of the at least one floating point number, generating a corresponding prediction error with a binary length potentially equal to or lower than a length of the at least a portion of the at least one floating point number, selectively encoding the prediction error or the corresponding at least a portion of the at least one floating point number based on a number of bits to be represented and providing a differentiation bit to indicate whether the prediction error or the corresponding at least a portion of the at least one floating point number is encoded.

Advantageously, illustrative embodiments of the invention provide improved lossless compression and decompression of seismic data and other floating point data. These and other features and advantages of the present invention will become more readily apparent from the accompanying drawings and the following detailed description.

DETAILED DESCRIPTION

Illustrative embodiments of the present invention will be described herein with reference to exemplary communication, storage and processing devices. It is to be appreciated, however, that the invention is not restricted to use with the particular illustrative configurations shown. Aspects of the invention provide methods and apparatus for content-aware lossless compression and decompression of floating point data, such as seismic data. While the exemplary embodiment is described herein using seismic data, aspects of the present invention can be applied to other forms of floating point data, as would be apparent to a person of ordinary skill in the art based on the present disclosure.

According to one aspect of the invention, a data oriented method for lossless compression of floating point data, such as seismic data, is provided that employs observed phenomena in the data to obtain high compression ratios with fast algorithms. The disclosed methods can optionally be tuned for fast compression and decompression (Turbo Version) or for maximum compression (Max Version).

In one exemplary implementation, a number of exemplary compression techniques are applied to sequences of floating point numbers that represent, for example, seismic data samples. As discussed further below, floating point numbers are often represented using one bit to indicate the sign of the number and the remaining bits indicating an exponent at a certain base and a significand.

A first exemplary compression technique, referred to herein as minimal-length compression, classifies the samples so that codes describing both the exponent and the length of the significand can be used to keep only the necessary bits to represent each sample. A second exemplary compression technique, referred to herein as alignment compression, exploits repetition patterns that can be observed in the samples when they are aligned to the same exponent, so that numbers can be broken into parts that repeat frequently and other parts that do not. Such a repetition is observed in the lower bits of the samples and can be efficiently encoded using a dictionary-based method. The third technique combines the former two techniques with prediction models that aim at reducing the entropy of the data. A data analysis step is also employed to decide which technique is the best for each input dataset. All these techniques can still be further combined with existing entropy encoders to achieve even higher levels of data compression.

Seismic Data

Oil and gas companies typically acquire and process seismic data from a given prospect area before drilling a well in the area. Seismic acquisition comprises generating acoustic waves using a source, such as a vibrator unit, dynamite shot, or an air gun, and then collecting data related to the reflected waves. The signals are collected by means of receivers referred to as geophones (when the acquisition occurs onshore) or hydrophones (when the acquisition occurs offshore). The receivers convert acoustic vibrations into streams of digital samples having in general a number of bits from 8 to 32 bits. Samples are continuously collected at intervals that have a constant duration (typically between 2 and 8 milliseconds) and data is typically collected by many receivers simultaneously. Seismic datasets can have many terabytes of raw data and their processing generates other additional datasets at various points throughout the seismic processing steps.

In spite of the fact that lossy compression algorithms are able to reach much higher compression ratio, lossless compression is desirable in the various steps of seismic processing. The original data has to be preserved with the original precision in order to avoid losing relevant information. In particular, complicated geologies, such as in pre-salt areas, have a very low signal-to-noise ratio, which makes the preservation of high data frequencies even more important (in lossy compression methods, high frequencies are often attenuated, so that higher compression ratios can be obtained). Therefore, it is often important to ensure that the employed compression methods are lossless.

Seismic processing workflows typically correspond to various steps that modify the raw data, creating new seismic data files at each step. Depending on the phase and processing techniques utilized, the size of the resulting file can be as large as the original file. Discovering ways to reduce the size occupied by these large data files and store them efficiently is a problem that needs to be addressed.

Thus, storage and transfer of seismic data demands lossless compression. The creation of algorithms that achieve high compression ratio are important to save storage and transmission time.

As seismic data files can be very large, the time to compress them can be very long, sometimes taking many days to obtain a good compression ratio. In this way, reducing the time to obtain good compression ratios by orders of magnitude can be very relevant to the industry.

Oil and gas companies are often global companies and the interpretation of seismic data is a process in which Geophysicists and Geologists often have to collaborate over distance. The efficient transmission of these data is essential to make this process productive. A good compression ratio is important to save time during the transmission, in particular when it is necessary to send data with limited bandwidth and without any information loss.

If seismic data files are stored in compressed form, when they are necessary for a seismic processing workflow, they need in principle to be decompressed first. If parts of the file (for instance specific seismic traces) can be accessed without having to decompress the entire file, it is possible to save storage space without hindering the flow of execution. In fact, as some seismic processing workflows are input/output (I/O) intensive, if less data is read from disk, the overall workflow performance can be improved. If the file I/O access is mimicked, workflows can work accessing the compressed data as if they had been previously decompressed.

More recently, seismic mega-surveys of processed data have been created to merge the results of processing various seismic acquisitions in the same area. As the result of new seismic processing, it might be necessary to update a mega-survey creating different versions of a same mega-survey that have many parts in common.

In this scenario, data deduplication can play an important role to save memory storage for backing up various similar files. If the data is compressed first, this can hinder the ability to deduplicate. In this context, it is important to have algorithms that are able to compress the data at the level of blocks, so that compression can occur after deduplication. In this way, data deduplication and compression can be effectively combined as part of a backup and recovery system.

In the oil and gas industry, seismic data is often stored as seismic traces using one of several standards developed by the Society of Exploration Geophysicists (SEG) for storing seismic data. The most commonly used format is SEG Y. Within the most common type of SEG Y files, a seismic trace is represented by a sequence of 32-bit floating-point numbers. To work with this type of data without losing any information, special care is necessary.

Thus, seismic sample data are often represented as floating point numbers. Typical formats are the IBM and IEEE 754 single precision, floating point representations, which specify how a real number is stored in 32 bits. These representations reserve one bit to indicate the sign of the number, with the other 31 bits being split into an exponent at a certain base and a significand, such that a real number R is calculated as:

$$R=(-1)^{sign} \times \text{significand} \times b^{exponent}$$

The main difference between the IBM floating point format and the IEEE 754 format is the number of bits reserved to each part and the base b of the exponent. The exemplary algorithms presented here have been designed for the IEEE 754 format, since it is often employed in modern day computing, but they can be generalized to other formats, as would be apparent to a person of ordinary skill in the art.

Length of Floating Point Data

Figure 1:
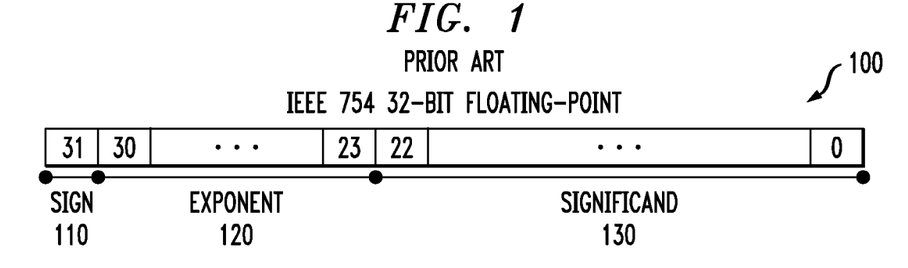
FIG. 1 illustrates an exemplary single precision floating point number in accordance with an exemplary IEEE 754 floating point standard.

FIG. 1 illustrates an exemplary single precision floating point number 100 in accordance with the IEEE 754 floating point standard. As shown in FIG. 1, the exemplary single precision floating point number 100 uses one bit for the sign 110, eight bits for the exponent 120 in base 2, and 23 bits for the normalized significand 130, meaning that a real number R is calculated as:

$$R=(-1)^{sign} \cdot 1.\text{significand} \times 2^{exponent}.$$

Despite the fact that acquired sensor data is quantized in 32 bits, however, sensors often do not have enough precision to use all 23 bits of the significand 130. Additionally, aspects of the present invention recognize that the use of bits is correlated with the exponent 120 of the floating point number 100. Thus, for many exponents 120, some bits in the least significant part of the significand 130 may all be zero.

Figure 2:
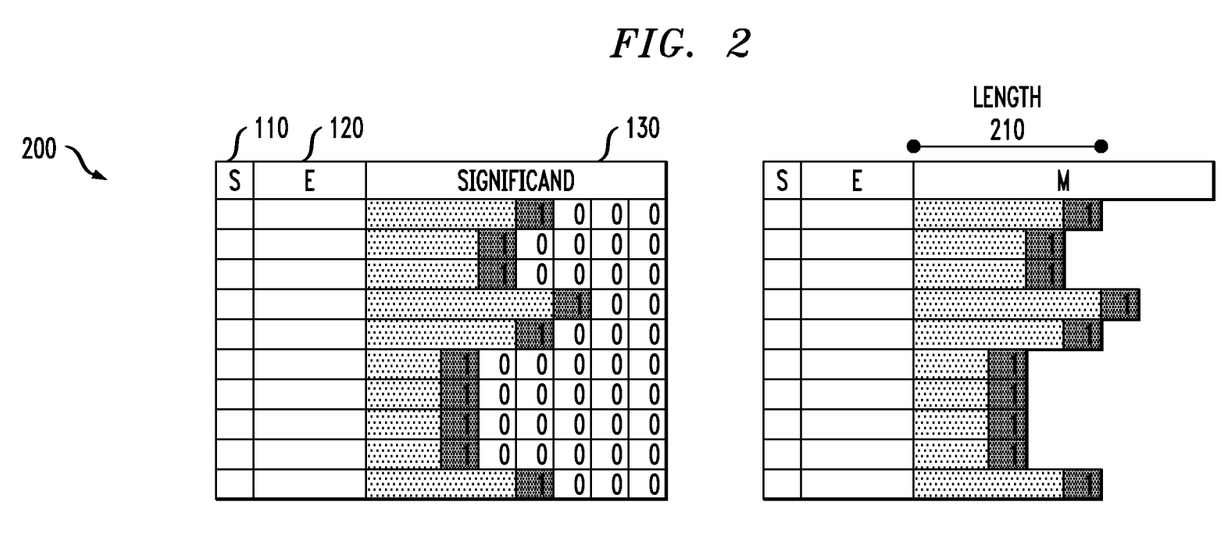
FIG. 2 illustrates a plurality of exemplary acquired sensor data values, where a number of bits in a least significant portion of each significand may all be zero.

FIG. 2 illustrates a plurality of exemplary acquired sensor data values 200, where a number of bits in the least significant portion of each significand 130 may all be zero. The number of bits from the most significant bit of the significand 130 and the least significant bit of the significand 130 having a value of one is referred to herein as the length 210 of the floating point number. One variation of the presented compression algorithm efficiently takes advantage of this characteristic, with the objective of representing numbers only with the bits that are necessary, thus discarding all trailing zeros as unnecessary data.

Another important observation is that samples of the same exponent 120 usually have varied lengths, with very few samples having the longest lengths. The concentration of samples with shorter lengths can be explored by the encoding schema in order to increase the compression ratio.

Thus, according to one aspect of the invention, a minimum-length compression method 400, as discussed further below in conjunction with FIG. 4, exploits correlations between exponents 120 and lengths 210. Generally, the exemplary minimum-length compression method 400 creates a histogram of all exponent 120 and length 210 pairs, and then removes zeros from frequently occurring classes. In this manner, the exemplary minimum-length compression method 400 classifies the floating point samples so that codes describing both the exponent 120 and the length 210 of the significand 130 can be used to keep only the necessary bits to represent each sample.

Repetition Patterns of Fractions

It has also been observed that in some cases, again due to sensor precision issues, the range of possible fractions that can be represented in seismic acquisitions is considerably limited. In general, the range of possible fractions that can be represented tend to be rounded to a multiple of 1/K, with K being data-dependent. Typical values for K are 16, 64, and 128.

Due to this limitation in representation, the fractional part of the floating point numbers tends to repeat throughout long sequences of data, with interesting repetition patterns. Thus, according to another aspect of the invention, an alignment compression method 500, as discussed further below in conjunction with FIG. 5, takes advantage of the repeating patterns of fractions to further increase compression ratios. Generally, the exemplary alignment compression method 500, exploits repetition patterns that can be observed in the floating point samples when they are aligned to the same exponent 120, so that numbers can be broken into parts that repeat frequently and other parts that do not. Such a repetition is observed in the lower bits of the samples and can be efficiently encoded using a dictionary-based method.

Predictability of the Time Series

As seismic traces are a special kind of time series, with systematic ways to approximate the value of the next sample based on the past, the residuals (or errors in the approximation) can be stored instead of the original values and the original values can be restored at decompression time by summing the residuals with the predictions. This strategy has the potential to reduce the entropy of the data when the residuals can be represented with fewer bits.

Thus, in one exemplary embodiment, the exemplary minimum-length compression method 400 and the exemplary alignment compression method 500 are optionally combined with prediction models that aim to reduce the entropy of the data. Two prediction methods are employed in the exemplary embodiment:

- a combination of ARIMA (autoregressive integrated moving average) and GARCH (generalized, autoregressive, conditional heteroscedasticity) models (see, e.g., U.S. patent application Ser. No. 14/230,510, filed Mar. 31, 2014, entitled "Heteroscedastic Data Compression Using Arima-Garch Model Estimation," incorporated by reference herein); and
- adaptive filtering methods, such as Recursive Least Squares (RLS), which are known as an efficient method to fit seismic data (See, for example, Monson H. Hayes, "9.4: Recursive Least Squares," Statistical Digital Signal Processing and Modeling, p. 541 (Wiley, 1996, incorporated by reference herein).

Depending on the level of noise across the data and the time requirements for compression and decompression, the best prediction method may vary. In addition, it is straightforward to reduce the entropy when data is represented by integers. When data is represented by floating point numbers, however, residuals do not necessarily have fewer bits than the original values. A method is provided to modify the prediction method so that whenever the absolute value of the residual is less than the absolute value of the original, the residual will have a shorter or at most an equal length when compared to the length of the original value.

Content-Aware Lossless Compression

Figure 3:
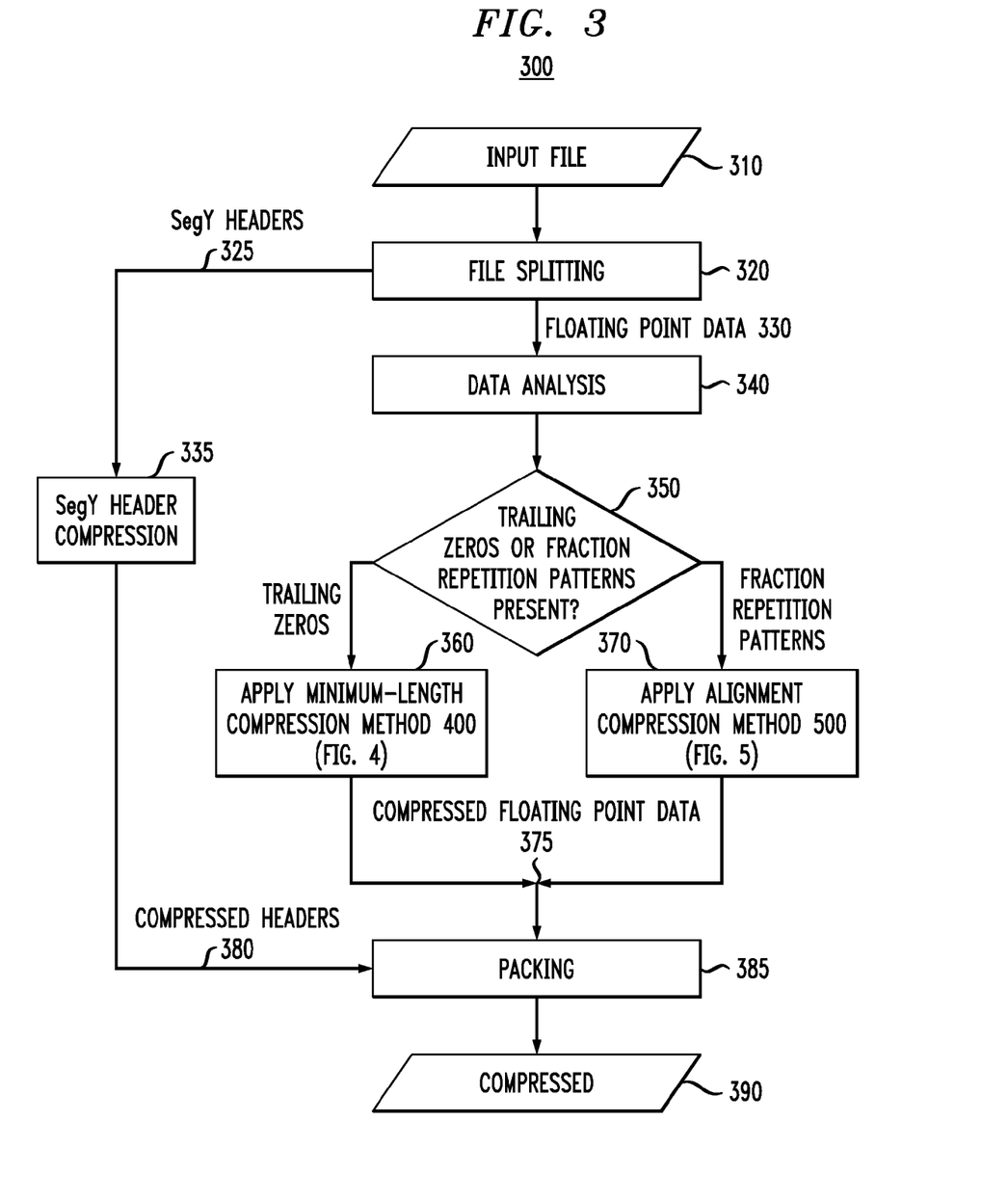
FIG. 3 is a flow chart illustrating an exemplary implementation of a data compression process incorporating aspects of the present invention.

FIG. 3 is a flow chart illustrating an exemplary implementation of a data compression process 300 incorporating aspects of the present invention. The exemplary data compression process 300 processes seismic data stored in SGY files. Compression of other kinds of floating point data can be adapted from the exemplary embodiment, as would be apparent to a person of ordinary skill in the art. Overall, an input file 310 is split into SegY headers 325 and floating point data values 330 at a file splitting stage 320. The SegY headers 325 are compressed during step 335, for example, with standard entropy encoders.

The floating point data values 330 are processed during step 340 to determine which compression technique 400, 500 is the best for the input file 310, and will follow one of two possible workflows. The data analysis 340 can be carried out on random, small subsets of the input file 310. Statistics on the length of floating point data and on repetition patterns are obtained and ranked. By dividing the input file 310 into chunks, the choice of the compression workflow can optionally be optimized on a chunk-by-chunk basis, enabling the compression of several chunks to be executed in parallel, to maximize performance.

A test is performed during step 350 to determine if trailing zeros or fraction repetition patterns are present in the input file 310. If it is determined during step 350 that trailing zeros are present, then program control proceeds to step 360 for compression using the minimum-length compression method 400 (FIG. 4) to process floating point data that can be trimmed. If, however, it is determined during step 350 that fraction repetition patterns are present, then program control proceeds to step 370 for compression using the exemplary alignment compression method 500 (FIG. 5). As discussed further below in conjunction with FIGS. 4 and 5, each workflow type can optionally be tuned for turbo or maximal compression.

Finally, compressed floating point data values 375 and compressed headers 380 are applied to a packing module during step 385, which organizes the compressed floating point data values 375 and compressed headers 380 in one or more compressed files 390 for access by a decompressor.

The algorithms for decompressing the compressed data are straightforward to a person of ordinary skill in the art, based on the discussion of the compression algorithms provided herein. The execution times of the decompression algorithms vary between 50% and 100% of the compression times. Thus, the remaining discussion focuses primarily on the description of the compression algorithms.

Min-Length Compression

Figure 4:
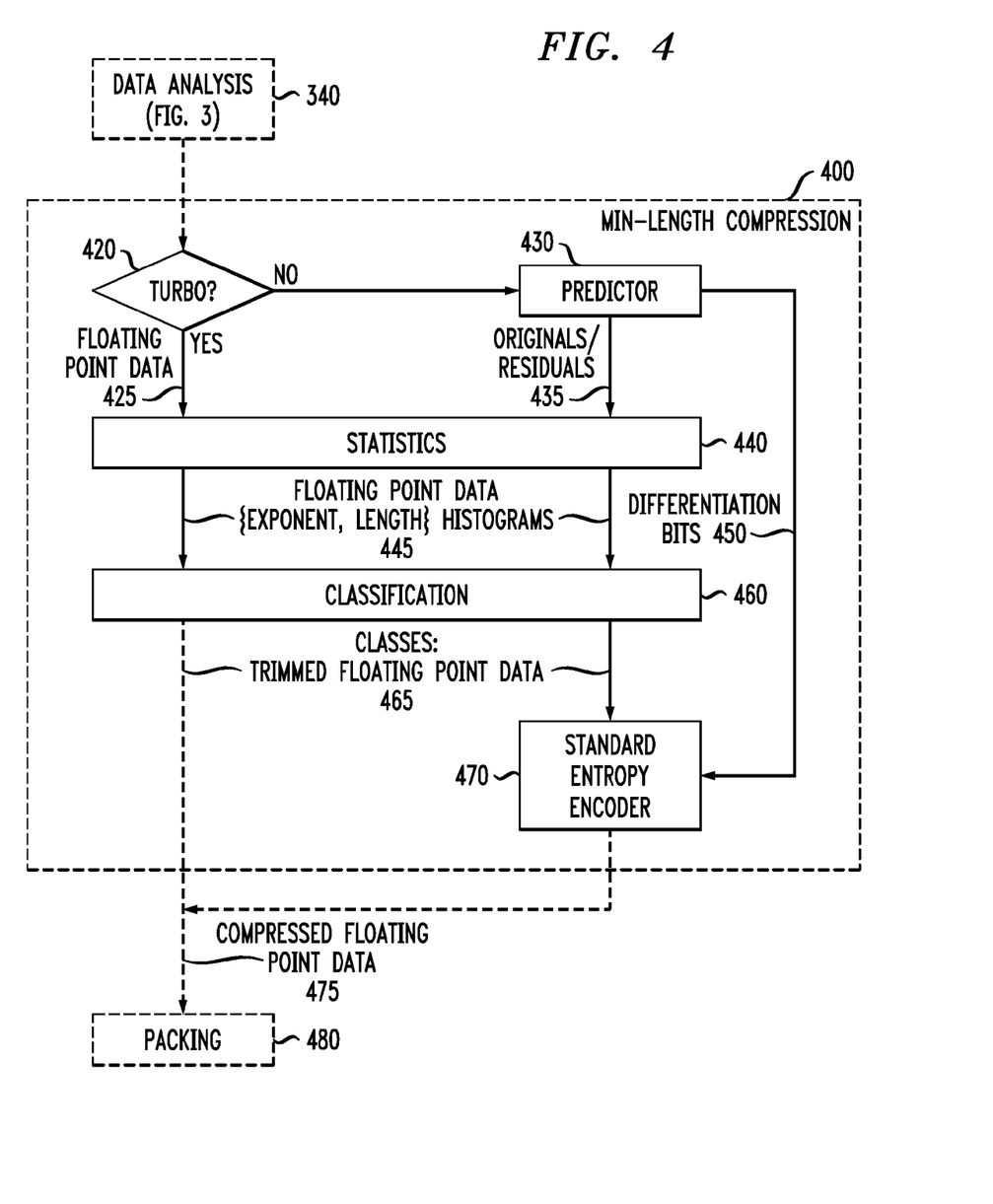
FIG. 4 is a flow chart illustrating an exemplary implementation of a minimum-length compression method incorporating aspects of the present invention.
Figure 5:
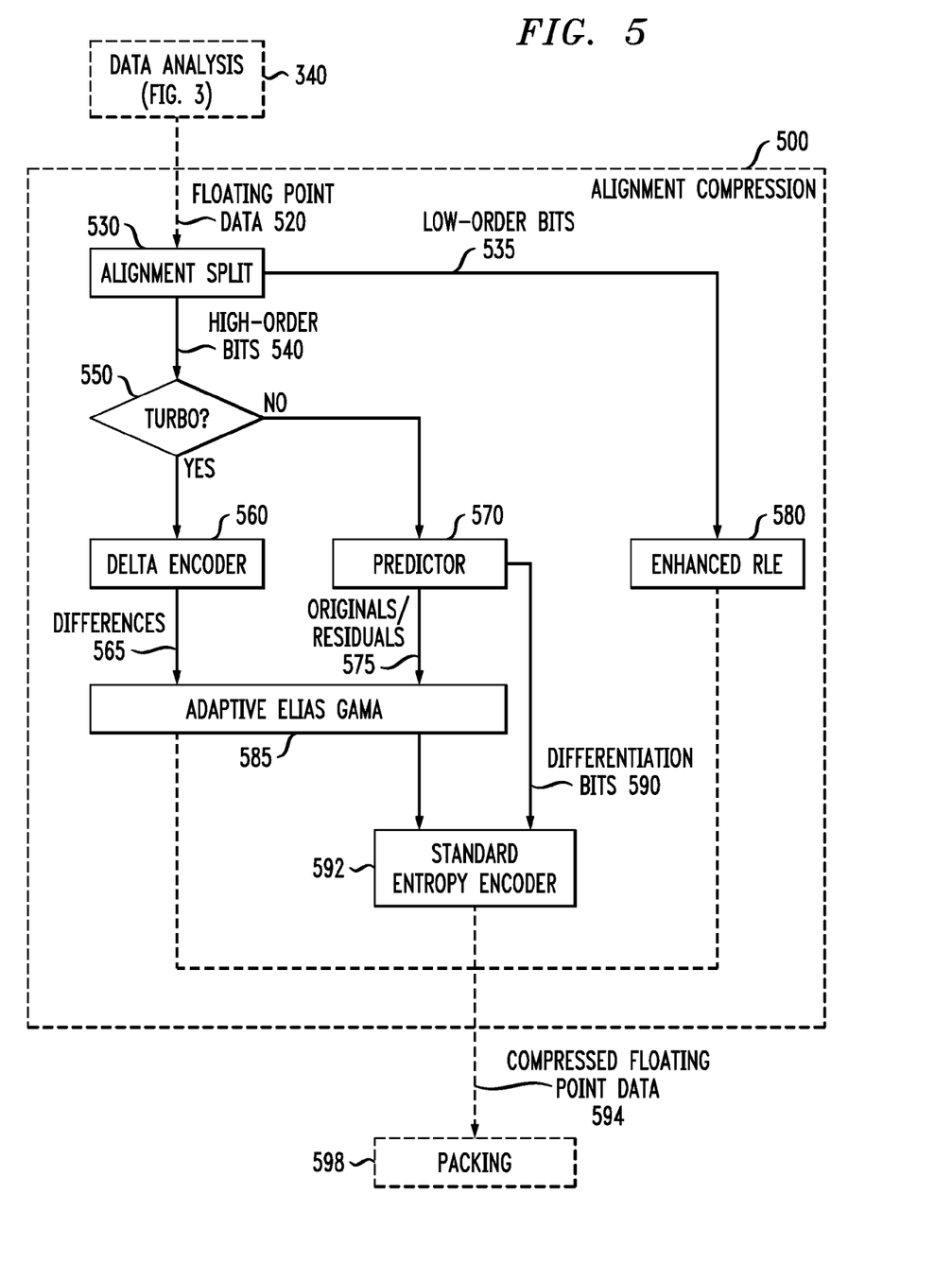
FIG. 5 is a flow chart illustrating an exemplary implementation of an alignment compression method incorporating aspects of the present invention.

FIG. 4 is a flow chart illustrating an exemplary implementation of the minimum-length compression method 400 incorporating aspects of the present invention. As previously indicated, the exemplary minimum-length compression method 400 compresses the input file 310 by removing unnecessary trailing zeros. If zeros are removed from the original data, this information needs to be stored so that the original number can be rebuilt in the decompression phase, without data loss. Bookkeeping for such information for every sample can be costly and may result in poor compression performance. The exemplary minimum-length compression method 400 balances the removal of zeros and the bookkeeping. As discussed above, the minimum-length compression method 400 can optionally be tuned for turbo or maximal compression.

Thus, a test is performed during step 420 to determine if a turbo compression or a maximal compression will be performed. If it is determined during step 420 that a turbo compression will be performed, then program control proceeds directly to step 440 to process the floating point data 425.

The exemplary minimum-length compression method 400 works in two passes through the data. In the first pass, statistics on the lengths of the significands 130 and their correlation with the corresponding exponents 120 are gathered during step 440. Every {exponent, length} pair is defined as a class and the statistics indicate how many bits could be saved if a specific code is created for that class and the trailing zeros of the significand of the samples of that class are removed. The output of the statistics phase 440 is a collection of histograms 445 of {exponent, length} pairs.

Given a (configurable) superior limit, N>0, to the number of classes to be represented, the exemplary minimum-length compression method 400 carries out a second pass through the histogram data 445 during step 460, removing zeros from samples of those classes that will yield the best compression ratios in the trimmed floating point data 465. The referred superior limit N determines how many bits are necessary to store class codes associated with {exponent, length} pairs. The remaining classes are optionally grouped so that the highest number of zeros can be removed with the least amount of bookkeeping.

For classes associated with {exponent, length} pairs, let $B_c = \lceil \log_2 N \rceil$ be the number of bits necessary to store class codes, $B_s=1$ be the number of bits to store the sign of the floating point number, and $B_l$=length be the number of bits to store its significand. The classification of the samples during step 460 creates six types of classes:

Classes that represent a single exponent and a single length: in this case, for each sample, $[B_s+B_c+(B_l-1)]$ bits are stored, since the least significant bit of the significand 130 is known to be 1 and, as such, does not need to be stored.

Classes that represent, for a single exponent, all lengths equal to or less than the length representative of the class: in this case, $[B_s+B_c+B_l]$ bits are stored for each sample (note that the least significant bit needs to be stored).

Classes that combine consecutive exponents that can be aligned, having a maximum length: in this case, $[B_s+B_c+B_l+1]$ bits are stored. Notice that the most significant bit 1 of the significand 130, which is hidden in the IEEE 754 format, has to be explicitly represented when numbers having different exponents are mixed, so that the alignment can be reverted upon decompression.

Classes that combine pairs of exponents 120 that have different lengths 210: in this case, each sample can be represented by one extra bit that distinguishes the case of one exponent 120 from the other and the corresponding length 210 minus one bit, since we do not need do store the least significant bit. Thus, $[B_s+B_c+B_l]$ bits are stored for each sample of these classes.

Classes that combine exponents 120 that only have associated lengths 210 of zero or one bit: in this case, no bits of the significand 130 are stored, only a code with $B_z = \lceil \log_2 N_z \rceil$ bits (wherein $N_z$ is the total number of zero-length classes), which will enable the reconstruction of the class at the decompression time. Consequently, $[B_s+B_c+B_z]$ bits are stored.

Classes that handle exceptions: the IEEE 754 format specifies special binary codes for numbers that cannot be represented (also known as "not-a-number", or NaN). These are stored as members of the zero-length classes, in their original form (i.e., with 32 bits), with $[B_s+B_c+B_z+32]$ bits in total.

The grouping of the classes is performed in such a way that most of the samples have a code that exactly specifies the exponent 120 and the length 210. Classes that group exponents 120 and lengths 210 are chosen to substantially maximize the overall result. As the representation of the samples in these classes demand additional bits, exponents 120 and lengths 210 are grouped that have lower rates in the statistics. Typically, for each exponent 120, longer lengths 210 that do not have high frequencies are grouped. Additionally, short lengths, all of them with low frequencies, are grouped in a single class.

The size of the code is a (configurable) parameter of the minimum-length compression method 400, which may be defined as either 5 or 6 bits, for example.

If it is determined during step 420 that a maximal compression will be performed, then a prediction is performed during step 430, before program control proceeds to step 440 to process the original values and residual values 435. The variation of the minimum-length compression method 400 for maximum compression works in a similar manner as the turbo version described above. The difference is that a linear prediction algorithm is employed during step 430 to predict the value of every data sample based on a sequence of previous samples. A number of exemplary algorithms are available. See, for example, Monson H. Hayes, "9.4: Recursive Least Squares," Statistical Digital Signal Processing and Modeling, p. 541 (Wiley, 1996); or U.S. patent application Ser. No. 14/230,510, filed Mar. 31, 2014, entitled "Heteroscedastic Data Compression Using Arima-Garch Model Estimation," each incorporated by reference herein.

Generally, a linear prediction algorithm is employed during step 430 in order to use a prediction error, or residual, as the input for the compression algorithm, instead of the original data. Depending on the quality of the employed predictor, the residual can be very small. Consequently, it would need fewer significant bits to be represented, in comparison with the original data, resulting in more effective compression.

In the case of floating point data, the residual could have a longer length, even if its absolute value is lower than that of the original value. To ensure that the residual values demand fewer bits than the original values, the following strategy is adopted in the exemplary embodiment:

During compression, the prediction and the original value are aligned to the same exponent, and the prediction is truncated at the bit that precedes the least significant bit 1 of the original value. By doing this, the least significant bit of the residual will be the least significant bit 1 of the original value when they are aligned. If the absolute value of the residual is lower than that of the original value, its length is equal to or shorter than that of the original value when the exponents are restored.

During decompression, the residual value is aligned with the prediction (which is the same prediction originated at compression time) and the prediction is truncated at the bit that precedes the least significant bit 1 of the residual. The residual is then added to the prediction in order to exactly obtain the original value.

On average, it has been observed that residuals are indeed "shorter" than the original data samples. In order to maximize the compression ratios even further, the residual is replaced with the original sample whenever the former needs, in reality, more bits to be represented. Only one bit of bookkeeping, referred to in FIG. 4 as a differentiation bit 450, is necessary to differentiate between the two types, therefore with minimal impact. As the frequency in which residuals are longer than the original values is low, the compression of this differentiation bit 450 is very high, so that this differentiation tends to increase compression ratio.

In the maximum compression mode, the trimmed floating point data 465 generated by the classification 460 and the differentiation bits 450 are further processed using an entropy encoder 470, in a known manner.

Finally, compressed floating point data values 475 are applied to a packing module during step 480, which organizes the compressed floating point data values 475 in one or more compressed files for access by a decompressor.

Alignment Compression

FIG. 5 is a flow chart illustrating an exemplary implementation of the alignment compression method 500 incorporating aspects of the present invention. The exemplary alignment compression method 500 leverages repetition patterns in the fractional part of the seismic floating point data, as described above, for improved compression.

Existing compression algorithms are specialized in data deduplication. Although many existing compression algorithms are able to cover a large spectrum of repetition patterns, the alignment compression method 500 employs more in-depth analyses of patterns present in seismic sample data and is therefore fine-tuned for the compression of such type of data.

Generally, the alignment compression method 500 recognizes that the repetition patterns occur primarily in the fractional part of the sample data. Due to sensor precision limitations, only a restricted set of fractions might be represented during data acquisition. These fractions occur frequently, and they also tend to repeat in alternating patterns along extended sequences of samples. Having that in mind, the alignment compression method 500 works by splitting the input floating point data into integral and fractional parts during step 530. Splitting a floating point number means to find the bit of the significand 130 that corresponds to the location of the radix point, taking into account the exponent of the number. A "high order" (integral) significand 540 and a "low order" (fractional) significand 535 are generated as a result of this process. The splitting performed during step 530 can be done in one of two possible ways:

Align the number to the exponent zero (most typical approach). In this case, the split precisely defines the integral and fractional parts of the number.

Align the number to a calculated exponent. Since alignment involves binary shifting operations within 32 bits, it might not be possible to align the number to the zero exponent, depending on the distribution of the exponents across the data samples. As a result, the "central" exponent is calculated from this distribution, and all the samples are aligned to that exponent.

Whichever align/split option is chosen for step 530, there will probably be cases in which the operation cannot be done. Those will be treated as exceptions in a later step of the exemplary alignment compression method 500, described further herein. From the data analyses, it has been observed that these exceptions have very low frequency, and therefore cause minimal impact on the compression performance.

In either case, the low order part 535 resulting from the split operation must still be aligned (usually with the most significant bit of the significand 130) so that the repetition patterns appear in binary form.

As discussed above, the exemplary alignment compression method 500 can optionally be tuned for turbo or maximal compression, which have an impact on the integral part of the data only. Thus, a test is performed during step 550 to determine if a turbo compression or a maximal compression will be performed. If it is determined during step 550 that a turbo compression will be performed, then program control proceeds to step 560, wherein a delta encoder is applied to the high order bits 540.

The exemplary alignment compression method 500 works in a single pass through the integral data. Since the data samples are a discretization of a physical phenomenon, it is expected that the difference between the integral (or high order) part of subsequent samples (i.e., an approximation of the derivative of the function corresponding to the phenomenon) will be small. In effect, this pattern can be observed throughout the data. The first step of the algorithm following the split/align operation is thus the delta encoder during step 560. The delta encoder receives as input the original samples and outputs the differences 565 between each sample and the previous one. Since the differences 565 between the integral part of subsequent samples are overall small, their entropy tends to be lower than that of the input samples.

The differences 565 between the integral part of subsequent samples are encoded during step 585 using an adaptive Elias Gama entropy encoder. See, for example, P. Elias, "Universal Codeword Sets and Representations of the Integers," IEEE Trans. on Information Theory, Vol. 21, No. 2, pp. 194-203 (March 1975), incorporated by reference herein. The Elias Gama encoder is suited for geometric probability distributions of numbers x, of the form $P(x)=(1-p)^{x-1}p$, where p is a constant less than 1. Such distributions indicate that small numbers (i.e., needing fewer bits to be represented) occur much more frequently than large numbers. The encoder transforms input numbers into codes of variable length, by fitting them into bins whose sizes are increasing powers of 2, that is, 2, 4, 8, 16, 32, 64, etc. A number N to be encoded is calculated as $N=2^{bin\text{-}index}+(N \text{ modulo } 2^{bin\text{-}index})$ and is thus represented by the bin-index in unary form (a sequence of bin-index zeros) followed by the binary form of the result of the modulo operation, which by definition requires bin-index bits to be represented. Following this scheme, the alignment compression method 500 will encode the most frequent numbers with very few bits.

Aspects of the invention extend the Elias Gama algorithm to make it adapt to distributions that do not exactly follow the pattern of the form $P(x)=(1-p)^{x-1}p$, but still have small numbers occurring more frequently. Generally, the inferior limit of the encoding bins is increased, so that they start at the point in which the data seems to more closely fit a geometric distribution, while the superior limit is reduced to the point where the highest number within the data can be represented.

To cope with the align/split exceptions discussed above, an extra bin is added, in which the samples falling in that category are represented in their original form.

If it is determined during step 550 that a maximal compression will be performed, then a prediction is performed during step 570 to reduce the entropy of the integral part of the input data, before program control proceeds to step 585 to process the original values and residual values 575. The variation of the alignment compression method 500 for maximum compression works in a similar manner as the turbo version described above. The difference is that an integer linear prediction algorithm is employed during step 570 to predict the value of the integral part of every data sample based on a sequence of previous samples. A number of exemplary algorithms are available. See, for example, Monson H. Hayes, "9.4: Recursive Least Squares," Statistical Digital Signal Processing and Modeling, p. 541 (Wiley, 1996); or U.S. patent application Ser. No. 14/230,510, filed Mar. 31, 2014, entitled "Heteroscedastic Data Compression Using Arima-Garch Model Estimation," each incorporated by reference herein. The choice of predictor follows the same reasoning described above for the minimum-length compression method 400, including the strategy of truncating the residuals in case they need more bits to be represented than the original data and the compression of the differentiation bits with standard entropy encoders.

Generally, a linear prediction algorithm is employed during step 570 in order to use a prediction error, or residual, as the input for the compression algorithm, instead of the original data. Depending on the quality of the employed predictor, the residual can be very small. Consequently, it would need fewer significant bits to be represented, in comparison with the original data, resulting in more effective compression.

The delta encoder 560 is not used in the maximum compression mode, since the combination of residuals and original values may no longer have the same differentiability patterns observed in the original data alone.

The original values and residual values 575 generated by the prediction 570 are encoded during step 585 using the adaptive Elias Gama entropy encoder, in the manner described above for the turbo mode. The output of the adaptive Elias Gama encoder 585 is provided to an entropy encoder during step 592, in a known manner, so that any pattern still present in the encoded data is identified and further compressed.

Finally, compressed floating point data values 594 are applied to a packing module during step 598, which organizes the compressed floating point data values 594 in one or more compressed files for access by a decompressor.

The fractional part (or low order bits 535) generated by the alignment split 530 are processed by a Run-Length Encoding (RLE) algorithm during step 580. The Run-Length Encoding (RLE) algorithm is effective when the same symbol appears throughout long sequences of data. In those cases, the sequence of occurrences can be replaced by a single {symbol, number of repetitions} pair.

It has been observed that the sequences of repetitions of fractions follow an even more interesting pattern of repetition, in which pairs of sequences of symbols (numbers) alternate between them, i.e.,

AAAAAABBBBAAAABBBBBBBAAAAC-
CCCDDDDCCCCCCDDDEEEEFFFFEE . . . .

In order to achieve compression ratios with an average count of less than one bit per sample, an enhanced form of the Run-Length encoding algorithm has been devised to cope with the patterns above. In this form, two concepts are dealt with:

A Block represents a sequence of repetitions of the same symbol, e.g., A6, B4, A4, B7, A4, C4, D4, C6, etc. are blocks of the sequence above.

A MegaBlock (MB) represents a sequence of repetitions alternating two symbols, e.g., $MB_1$=(A6, B4, A4, B7, A4), $MB_2$=(C4, D4, C6, D3), etc.

One MegaBlock is thus described by the number of blocks it contains and the two symbols that alternate, the first one being the symbol of the first block of the sequence. By doing this, only the number of repetitions (or block sizes) of each symbol needs to be encoded within the MegaBlock. Additionally, since the number of unique fractions tends to be small, a dictionary is created to store them. As a consequence, the MegaBlocks do not need to store the repeating fractions themselves, only their location in the dictionary. Finally, in order to save extra bits per MegaBlock, some metadata are added to each MegaBlock to indicate how many bits are strictly necessary to store dictionary locations and blocks sizes. A MegaBlock $MB_i$ is thus defined as:

$MB_i$=($N_b$, $B_d$, $D_1$, $D_2$, $B_b$, $BL_1$, $BL_2$, $BL_3$, . . . , $BL_{Nb}$), wherein $N_b$ represents the total number of blocks in the mega block, $B_d$ is the number of bits necessary to store dictionary locations $D_1$ and $D_2$ of the two repeating symbols, $B_b$ is the number of bits necessary to store each block size, $BL_1$ is the block size of the symbol in the position $D_1$ of the dictionary, $BL_2$ is the block size of the symbol in the position $D_2$ of the dictionary, $BL_3$ is the block size of the symbol in the position $D_1$ again, and so on.

For example, $MB_1$ above would be defined as $MB_1$=(5, 2, 1, 2, 3, 6, 4, 4, 7, 4), for a dictionary D=(A, B, C, D, E, F) derived from the example sequence. Note that only two bits would be necessary for dictionary locations and only three bits would be necessary for block sizes, since the largest dictionary position is two (knowing that ($\log_2 2$)+1=2) and the largest block size is represented by number six (knowing that $\lceil \log_2 6 \rceil$=3).

Combining Compression and Deduplication

Within a scenario in which different (but similar) versions of seismic mega-surveys have to be stored for backup, deduplication of the parts of the data that are changed from one version to the other is an important resource to save space. In this scenario, deduplication should be applied prior to compression. This is viable because the data compression process 300 can be applied to separate data chunks.

It might be the case, however, that the size of the chunks is not optimal for compression by the data compression process 300. The overall benefit of combining compression and deduplication compared to the application of a single optimized compression depends on the size of the data chunks and on how often parts of the seismic mega surveys remain unchanged from one version to the other.

CONCLUSION

Aspects of the present invention are described herein with reference to flowchart illustrations and/or block diagrams of methods, apparatus (systems) and computer program products according to embodiments of the invention. It is to be appreciated that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

As further described herein, such computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. Accordingly, as further detailed below, at least one embodiment of the invention includes an article of manufacture tangibly embodying computer readable instructions which, when implemented, cause a computer to carry out techniques described herein. An article of manufacture, a computer program product or a computer readable storage medium, as used herein, is not to be construed as being transitory signals, such as electromagnetic waves.

The computer program instructions may also be loaded onto a computer or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, component, segment, or portion of code, which comprises at least one executable instruction for implementing the specified logical function(s). It should be noted that the functions noted in the block may occur out of the order noted in the figures.

Accordingly, the techniques described herein can include providing a system, wherein the system includes distinct software modules, each being embodied on a tangible computer-readable recordable storage medium (for example, all modules embodied on the same medium, or each modules embodied on a different medium). The modules can run, for example, on a hardware processor, and the techniques detailed herein can be carried out using the distinct software modules of the system executing on a hardware processor.

Additionally, the techniques detailed herein can also be implemented via a computer program product that includes computer useable program code stored in a computer readable storage medium in a data processing system, wherein the computer useable program code was downloaded over a network from a remote data processing system. The computer program product can also include, for example, computer useable program code that is stored in a computer readable storage medium in a server data processing system, wherein the computer useable program code is downloaded over a network to a remote data processing system for use in a computer readable storage medium with the remote system.

As will be appreciated by one skilled in the art, aspects of the present invention may take the form of an entirely hardware embodiment, an entirely software embodiment (including firmware, resident software, micro-code, etc.) or an embodiment combining software and hardware aspects that may all generally be referred to herein as a "module" or "system."

An aspect of the invention or elements thereof can be implemented in the form of an apparatus including a memory and at least one processor that is coupled to the memory and operative to perform the techniques detailed herein. Also, as described herein, aspects of the present invention may take the form of a computer program product embodied in a computer readable medium having computer readable program code embodied thereon.

Figure 6:
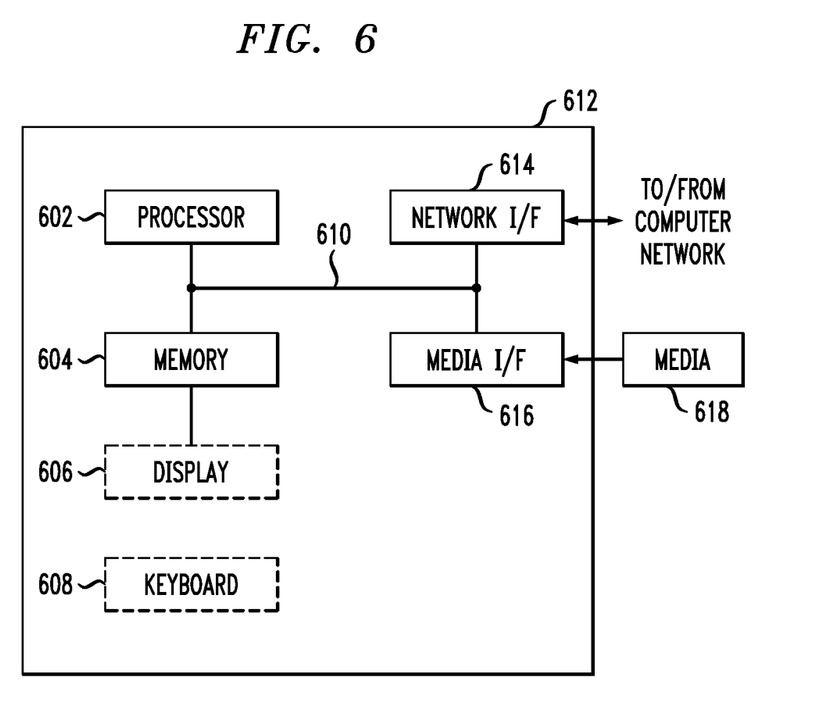
FIG. 6 is a system diagram of an exemplary computer system on which at least one embodiment of the invention can be implemented.

By way of example, an aspect of the present invention can make use of software running on a general purpose computer. FIG. 6 is a system diagram of an exemplary computer system on which at least one embodiment of the invention can be implemented. As depicted in FIG. 6, an example implementation employs, for example, a processor 602, a memory 604, and an input/output interface formed, for example, by a display 606 and a keyboard 608. The term "processor" as used herein includes any processing device(s), such as, for example, one that includes a central processing unit (CPU) and/or other forms of processing circuitry. The term "memory" includes memory associated with a processor or CPU, such as, for example, random access memory (RAM), read only memory (ROM), a fixed memory device (for example, a hard drive), a removable memory device (for example, a diskette), a flash memory, etc. Further, the phrase "input/output interface," as used herein, includes a mechanism for inputting data to the processing unit (for example, a mouse) and a mechanism for providing results associated with the processing unit (for example, a printer).

The processor 602, memory 604, and input/output interface such as display 606 and keyboard 608 can be interconnected, for example, via bus 610 as part of a data processing unit 612. Suitable interconnections via bus 610, can also be provided to a network interface 614 (such as a network card), which can be provided to interface with a computer network, and to a media interface 616 (such as a diskette or compact disc read-only memory (CD-ROM) drive), which can be provided to interface with media 618.

Accordingly, computer software including instructions or code for carrying out the techniques detailed herein can be stored in associated memory devices (for example, ROM, fixed or removable memory) and, when ready to be utilized, loaded in part or in whole (for example, into RAM) and implemented by a CPU. Such software can include firmware, resident software, microcode, etc.

As noted above, a data processing system suitable for storing and/or executing program code includes at least one processor 602 coupled directly or indirectly to memory elements 604 through a system bus 610. The memory elements can include local memory employed during actual implementation of the program code, bulk storage, and cache memories which provide temporary storage of at least some program code in order to reduce the number of times code must be retrieved from bulk storage during implementation. Also, input/output (I/O) devices such as keyboards 608, displays 606, and pointing devices, can be coupled to the system either directly (such as via bus 610) or through intervening I/O controllers.

Network adapters such as network interface 614 (for example, a modem, a cable modem or an Ethernet card) can also be coupled to the system to enable the data processing system to become coupled to other data processing systems or remote printers or storage devices through intervening private or public networks.

As used herein, a "server" includes a physical data processing system (such as system 612 as depicted in FIG. 6) running a server program. It will be understood that such a physical server may or may not include a display and keyboard.

As noted, at least one embodiment of the invention can take the form of a computer program product embodied in a computer readable medium having computer readable program code embodied thereon. As will be appreciated, any combination of computer readable media may be utilized. The computer readable medium can include a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Examples include an electrical connection having one or more wires, a portable computer diskette, a hard disk, RAM, ROM, an erasable programmable read-only memory (EPROM), flash memory, an optical fiber, a portable CD-ROM, an optical storage device, a magnetic storage device, and/or any suitable combination of the foregoing. More generally, a computer readable storage medium may be any tangible medium that can contain, or store a program for use by or in connection with an instruction execution system, apparatus, or device.

Additionally, a computer readable signal medium may include a propagated data signal with computer readable program code embodied therein, for example, in baseband or as part of a carrier wave. Such a propagated signal may take any of a variety of forms such as, for example, electromagnetic, optical, or a suitable combination thereof. More generally, a computer readable signal medium may be any computer readable medium that is not a computer readable storage medium and that can communicate, propagate, or transport a program for use by or in connection with an instruction execution system, apparatus, or device.

Program code embodied on a computer readable medium can be transmitted using an appropriate medium such as, for example, wireless, wireline, optical fiber cable, radio frequency (RF), and/or a suitable combination of the foregoing. Computer program code for carrying out operations in accordance with one or more embodiments of the invention can be written in any combination of at least one programming language, including an object oriented programming language, and conventional procedural programming languages. The program code may execute entirely on a user's computer, partly on a user's computer, as a stand-alone software package, partly on a user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

In light of the above descriptions, it should be understood that the components illustrated herein can be implemented in various forms of hardware, software, or combinations thereof, for example, application specific integrated circuit(s) (ASICS), functional circuitry, an appropriately programmed general purpose digital computer with associated memory, etc.

Terminology used herein is for the purpose of describing particular embodiments only and is not intended to be limiting of the invention. For example, the singular forms "a," "an" and "the" are intended to include the plural forms as well, unless clearly indicated otherwise. It will be further understood that the terms "comprises" and/or "comprising," as used herein, specify the presence of stated features, integers, steps, operations, elements, and/or components, but do not preclude the presence or addition of another feature, integer, step, operation, element, component, and/or group thereof. Additionally, the corresponding structures, materials, acts, and equivalents of all means or step plus function elements in the claims are intended to include any structure, material, or act for performing the function in combination with other claimed elements as specifically claimed.

Also, it should again be emphasized that the above-described embodiments of the invention are presented for purposes of illustration only. Many variations and other alternative embodiments may be used. For example, the techniques are applicable to a wide variety of other types of communication systems, storage systems and processing devices that can benefit from improved compression of seismic data. Accordingly, the particular illustrative configurations of system and device elements detailed herein can be varied in other embodiments. These and numerous other alternative embodiments within the scope of the appended claims will be readily apparent to those skilled in the art.

What is claimed is:

1. A method for compressing at least one floating point number, said method comprising:
    obtaining said at least one floating point number represented using one or more bits to indicate a sign of said at least one floating point number and one or more additional exponent bits to indicate an exponent at a given base and a significand of said at least one floating point number;
    determining a length of said significand equal to a number of bits between a most significant bit of said significand and a least significant bit of said significand having a predefined binary value; and
    encoding said at least one floating point number by encoding, as a single code, an exponent/length pair comprising said exponent and said length, wherein one or more significant bits following said least significant bit of said significand having said predefined binary value are not included in said encoding.

2. The method of claim 1, further comprising the step of selecting a plurality of said exponent/length pairs based on a total number of said additional significant bits, wherein the total number of said additional significant bits for a particular exponent/length pair is obtained as a function of a frequency of occurrence of said particular exponent/length pair and the number of said additional significant bits for said particular exponent/length pair.

3. The method of claim 2, further comprising the step of encoding additional exponent/length pairs not in said plurality of exponent/length pairs using additional bits relative to an encoding of said plurality of exponent/length pairs.

4. The method of claim 1, wherein said one or more additional significant bits following said least significant bit of said significand having said predefined binary value are discarded as unnecessary data.

5. The method of claim 1, further comprising the step of decompressing said compressed at least one floating point number by restoring discarded bits based on said encoded length.

6. The method of claim 1, wherein said compressed at least one floating point number is one or more of stored, transmitted and processed.

7. The method of claim 1, wherein said at least one floating point number comprise seismic data.

8. The method of claim 1, further comprising the steps of, prior to said steps of obtaining, determining and encoding, applying a linear prediction algorithm to said at least one floating point number to generate a prediction, aligning the prediction to said exponent of said at least one floating point number, truncating the prediction to end at a bit immediately before a least significant bit having said predefined binary value of said at least one floating point number, generating a corresponding prediction error with a binary length potentially equal to or lower than a length of said at least one floating point number; and then employing said steps of obtaining, determining and encoding to selectively compress said prediction error or the corresponding at least one floating point number based on a number of bits to be represented and providing a differentiation bit to indicate whether said prediction error or the corresponding at least one floating point number is encoded.

9. The method of claim 1, wherein said method of claim 1 is selectively applied based on a data analysis of said obtained at least one floating point number.

10. The method of claim 1, wherein a first portion of said encoded at least one floating point number is decoded without decoding additional portions of said encoded at least one floating point number.

11. A computer program product comprising a tangible machine-readable storage medium having encoded therein executable code of one or more software programs, wherein the one or more software programs when executed perform the steps of the method of claim 1.

12. A method for compressing at least one floating point number, said method comprising:
   obtaining said at least one floating point number represented using one or more bits to indicate a sign of said at least one floating point number and one or more additional exponent bits to indicate an exponent at a given base and a significand of said at least one floating point number;
   aligning said at least one floating point number by moving a radix point of said at least one floating point number and updating said exponent so that said at least one floating point number is separated into an integral portion and a fractional portion, wherein a plurality of said fractional portions of said at least one floating point number comprises at least one repeating pattern;
   encoding said integral portion separately; and
   encoding said fractional portion of said at least one floating point number using a dictionary-based compression method.

13. The method of claim 12, wherein said dictionary-based compression method comprises a run-length encoding method.

14. The method of claim 12, wherein a given one of said at least one repeating pattern is encoded using a block code that replaces said at least one repeating pattern with a symbol indicating said given repeating pattern and a number of repetitions of said given repeating pattern.

15. The method of claim 12, wherein a plurality of said fractional portions of said at least one floating point number comprises at least one repeating pattern comprised of at least two alternating symbols and wherein a given one of said at least one repeating pattern is encoded using a mega block code that replaces said at least two alternating symbols with a first reference to a location of a first symbol in said dictionary, a second reference to a location of a second symbol in said dictionary, a total number of blocks with a same repeating said first and second symbol, and a sequence of block sizes representing a number of times each of said first and second symbol appear in a same order as said first and second symbol appear in said repeating pattern, along with metadata indicating a number of bits necessary to store the first and second references and said block sizes.

16. The method of claim 12, wherein said encoding of said integral portion comprises the steps of applying said integral portion of said at least one floating point number to a delta encoder that generates differences between a current integral portion and a previous integral portion; and encoding said differences using an adaptive Elias Gama entropy encoder.

17. The method of claim 16, wherein said adaptive Elias Gama entropy encoder transforms said differences into codes of variable length by fitting said integral portion of said at least one floating point number into a plurality of encoding bins, wherein an inferior limit of the encoding bins is increased such that said encoding bins start at a point in which the integral portion of said at least one floating point number substantially fits a geometric distribution and wherein the superior limit is reduced to a point from which a number of said integral portion of said at least one floating point that is represented in an original form, leaving one bin of said encoding bins for the encoding of exceptions, also stored in original form.

18. The method of claim 12, wherein said encoding of said integral portion comprises the steps of applying said integral portion of said at least one floating point number to a linear prediction algorithm to generate a prediction to said integral portion of said at least one floating point number, aligning the prediction to said exponent of said integral portion of said at least one floating point number, truncating the aligned prediction to obtain an integral number, generating a corresponding integral prediction error with a binary length equal to or lower than a length of said integral portion of said at least one floating point number; and employing an adaptive Elias Gama entropy encoder to selectively encode said prediction error or the corresponding integral portion of said at least one floating point number in original form as an exception based on a number of bits to be represented.

19. The method of claim 18, wherein said adaptive Elias Gama entropy encoder transforms said prediction error into codes of variable length by fitting said integral portion of said at least one floating point number into a plurality of encoding bins, wherein an inferior limit of the encoding bins is increased such that said encoding bins start at a point in which the integral portion of said at least one floating point number substantially fits a geometric distribution and wherein the superior limit is reduced to a point from which a number of said integral portion of said at least one floating point that is represented in an original form, leaving one bin of said encoding bins for the encoding of exceptions, also stored in original form.

20. The method of claim 12, wherein said method of claim 12 is selectively applied based on a data analysis of said obtained at least one floating point number.

21. The method of claim 12, wherein a first portion of an encoded version of said at least one floating point number is decoded without decoding additional portions of said encoded version of said at least one floating point number.

22. A system for compressing at least one floating point number, comprising:
- a memory; and
- at least one hardware device, coupled to the memory, operative to implement the following steps:
  - obtaining said at least one floating point number represented using one or more bits to indicate a sign of said at least one floating point number and one or more additional exponent bits to indicate an exponent at a given base and a significand of said at least one floating point number;
  - determining a length of said significand equal to a number of bits between a most significant bit of said significand and a least significant bit of said significand having a predefined binary value; and
  - encoding said at least one floating point number by encoding, as a single code, an exponent/length pair comprising said exponent and said length, wherein one or more significant bits following said least significant bit of said significand having said predefined binary value are not included in said encoding.

23. A system for compressing at least one floating point number, comprising:
- a memory; and
- at least one hardware device, coupled to the memory, operative to implement the following steps:
  - obtaining said at least one floating point number represented using one or more bits to indicate a sign of said at least one floating point number and one or more additional exponent bits to indicate an exponent at a given base and a significand of said at least one floating point number;
  - aligning said at least one floating point number by moving a radix point of said at least one floating point number and updating said exponent so that said at least one floating point number is separated into an integral portion and a fractional portion, wherein a plurality of said fractional portions of said at least one floating point number comprises at least one repeating pattern;
  - encoding said integral portion separately; and
  - encoding said fractional portion of said at least one floating point number using a dictionary-based compression method.

* * * * *